(12) United States Patent
Song et al.

(10) Patent No.: US 6,684,942 B2
(45) Date of Patent: Feb. 3, 2004

(54) HEAT SINK

(75) Inventors: Tae-Ho Song, Taejon (KR); Sung-Jin Kim, Taejon (KR)

(73) Assignee: Korea Advanced Institute of Science & Technology, Taejon (KR)

( * ) Notice: Subject to any disclaimer, the term of this patent is extended or adjusted under 35 U.S.C. 154(b) by 0 days.

(21) Appl. No.: 10/203,755

(22) PCT Filed: Dec. 23, 2000

(86) PCT No.: PCT/KR00/01528

§ 371 (c)(1),
(2), (4) Date: Aug. 12, 2002

(87) PCT Pub. No.: WO02/052912

PCT Pub. Date: Jul. 4, 2002

(65) Prior Publication Data

US 2003/0089490 A1 May 15, 2003

(51) Int. Cl.[7] ................................. H05K 7/20
(52) U.S. Cl. .................. 165/122; 165/80.3; 361/697
(58) Field of Search ............... 165/80.3, 121, 165/122, 185; 361/695, 696, 697, 704

(56) References Cited

U.S. PATENT DOCUMENTS

| 4,233,644 A | * | 11/1980 | Hwang et al. | 361/687 |
|---|---|---|---|---|
| 4,277,816 A | * | 7/1981 | Dunn et al. | 361/694 |
| 4,620,216 A | * | 10/1986 | Horvath | 257/713 |
| 4,851,965 A | * | 7/1989 | Gabuzda et al. | 361/691 |
| 5,021,924 A | * | 6/1991 | Kieda et al. | 361/699 |
| 5,063,476 A | | 11/1991 | Hamadah et al. | |
| 5,083,194 A | | 1/1992 | Bartilson | |
| 5,304,846 A | * | 4/1994 | Azar et al. | 257/722 |
| 5,361,188 A | * | 11/1994 | Kondou et al. | 361/695 |
| 5,428,503 A | * | 6/1995 | Matsushima et al. | 361/695 |
| 6,047,765 A | * | 4/2000 | Zhan | 165/80.3 |

FOREIGN PATENT DOCUMENTS

| DE | 4244303 A1 | * | 6/1994 | ........... F25D/31/00 |
|---|---|---|---|---|
| JP | 8-32263 A | | 2/1996 | |
| JP | 9-326579 A | | 12/1997 | |
| JP | 11-45967 A | | 2/1999 | |
| JP | 11-87956 A | | 3/1999 | |

* cited by examiner

Primary Examiner—Allen Flanigan
(74) Attorney, Agent, or Firm—Venable, LLP; Catherine M. Voorhees

(57) ABSTRACT

A heat sink is provided with a box-like body attached to heat dissipating surface of a heat-dissipating element. A separation board separates the box-like body into upper and lower parts. A number of side separation boards divide the lower part into several areas, and nozzle parts are inserted into the side separation boards parallel to the attaching surface. Pin-like fins are formed in the bottom face in the several areas divided by the side separation boards and an air carrying means is provided at an upper area formed by the separation board for supplying cooling air to fins through the nozzle parts.

14 Claims, 8 Drawing Sheets

HEAT SINK

TECHNICAL FIELD

This invention relates to a heat sink for cooling a heat radiating body, more particularly to a heat sink, which has an excellent cooling efficiency and can effectively minimize the reduction of the cooling performance due to the alien substance such as dust.

BACKGROUND ART

For small current-consuming electronic devices such as transistors, integrated circuits, it is unnecessary to consider the heat radiation, since they radiate little heat. However, devices such as microprocessor used in computer system radiate heat considerably and so it increases the temperature of devices. Data processing speed and efficiency of the devices largely depend on how the heat energy generated in such devices can be controlled and removed efficiently. In case that the heat increases severely, the devices can be damaged permanently.

The most conventional heat sinks are pin-fin-type as shown in FIG. 1, and its base is formed of a good heat transmission material such as aluminum and there are tens to hundreds of heat radiating fins with shape as teeth of comb on the base to radiate heat generated from the processor, etc. The heat sink is mounted on the center of the chip package of the computer chip, and is attached to it using resin or clip, etc.

Since the heat sink does not have a good heat radiating efficiency in itself, fans are generally used additionally to enhance performance by generating air stream of cooling wind compulsorily and to contact the air stream to the fins, so that the heat is removed efficiently. Accordingly, heat generated in the heat-generating devices such as a microprocessor is transferred to the heat sink and absorbed into the cooling wind.

There have been many ways to contact the air stream generated by fan to fins in the conventional art. The most basic way is to blow the air stream of the cooling wind generated by the fan to the base perpendicularly, that is, from the upper part of the fin to lower part of it as shown in FIG. 1A. A problem in connection with this way is that since the air stream flows parallel to the fin from its upper part to its lower part, the thermal transmission coefficient of the sidewall of the fin becomes small and so the cooling efficiency is not good.

Another way is to blow the air stream of fan parallel to the base of the heat sink as shown FIG. 1B. A problem in connection with this way is that in the case the dimension of the heat sink becomes large and its length becomes long to the direction of the air stream, the pressure drop becomes large and the temperature of the air stream increases as the air stream flows along the lower part, so that the cooling effect on the lower part is not good.

To complement the above defects of conventional art, some heat sinks have been developed such as described in U.S. Pat. Nos. 5,063,476 and 5,083,194.

The heat sink described in U.S. Pat. No. 5,063,476 is a cooling system of so called air collision method (see FIG. 1C), where air stream inputted to the air intake inlet by a fan installed in the air discharge outlet is directed to the space between a fin 26 and another adjacent fin 26 by way of a nozzle. However, a problem in connection with the patent is that in case the area where air stream which has gone through the space among the fins 26 of the heat sink 24 and has contacted to the base is small, cooling performance also may drops. Moreover, it is also a problem that a space to install the nozzle has to be guaranteed in the heat sink.

U.S. Pat. No. 5,083,194 has a constitution where inflow air through the path between substrates collides with the heat sink 16 through nozzle 26 like U.S. Pat. No. 5,063,476. However, as shown in FIG. 1D, the above way has the same problem that air stream of the fan flows parallel to the fins as described in the conventional art.

Additionally, heat sinks which blow cooling wind between the porous media have a problem, i.e., as time passes, an alien substance such as dust becomes deposited among fins, therefore, it shortens the cooling performance of heat sink and lifetime of it.

Conventionally, since user seldom disassembles the apparatus and cleanses the dust deposited in the heat sink, it is not possible to cleanse automatically the alien substance, once deposited in the heat sink.

DISCLOSURE OF INVENTION

An object of the present invention is to solve the problems of the conventional art such as law-efficiency of cooling performance and deposition of alien substance, and to provide a heat sink with excellent cooling efficiency.

Unlike the conventional method where cool air stream is provided parallel or perpendicularly to the pin fin, the present invention solves the problems by providing cool air stream to the heat sink with a slope to the pin fin.

These and other objects of the present invention are achieved through a first embodiment of the heat sink, which includes a rectangular parallel-piped body whose bottom plate is attached to the surface of a heat-generating device; upper-lower parts separating plate to separate the inner part of the rectangular parallel-piped body into upper and lower parts; side part separating plates formed between the bottom plate and the upper-lower parts separating plate with a slope to separate the lower space formed by the upper-lower parts separating plates into a plurality of sections; nozzle parts inserted in the middle of the side part separating plates with a slope to its attachment surface; a plurality of pin-type fins formed in the bottom surface of a plurality of sections separated by the upper-lower parts separating plates; and air stream transportation means installed on the upper space formed by the upper-lower parts separating plates and supplying cooling air stream to the fins through the nozzle parts.

These and other objects of the present invention are achieved through a second embodiment of the heat sink, which includes a rectangular parallel piped body whose bottom plate is attached to heat-generating surface of the heat-generating device; side part separating plates formed between the bottom plate and ceiling plate with a slope to separating the inner part of the rectangular parallel piped body; nozzle parts inserted in the middle of the side part separating plates with a slope to its attachment surface; a plurality of pin-type fins formed in the bottom surface of a plurality of sections separated by the side part separating plates; and air stream transportation means installed on the most end section among a plurality of sections and supplying cooling air stream to the fins through the nozzle parts.

Preferably, the slope of the side part separating plates to the base part may be in the range of 15 degree to 45 degree.

Preferably, the air stream transportation means may be a fan or a blower.

Preferably, the fan inflows air stream from the outer part of the heat sink or flows out air stream from the inner part of the heat sink.

Preferably, the outlet area of a nozzle is narrower than the inlet area of it.

BEST MODE FOR CARRYING OUT THE INVENTION

Followings are the descriptions about the embodiment of this invention referring to the included figures.
(First Embodiment)

Followings are the description for the first embodiment of the present invention referring to the FIG. 2 to FIG. 5.

Figure 2:
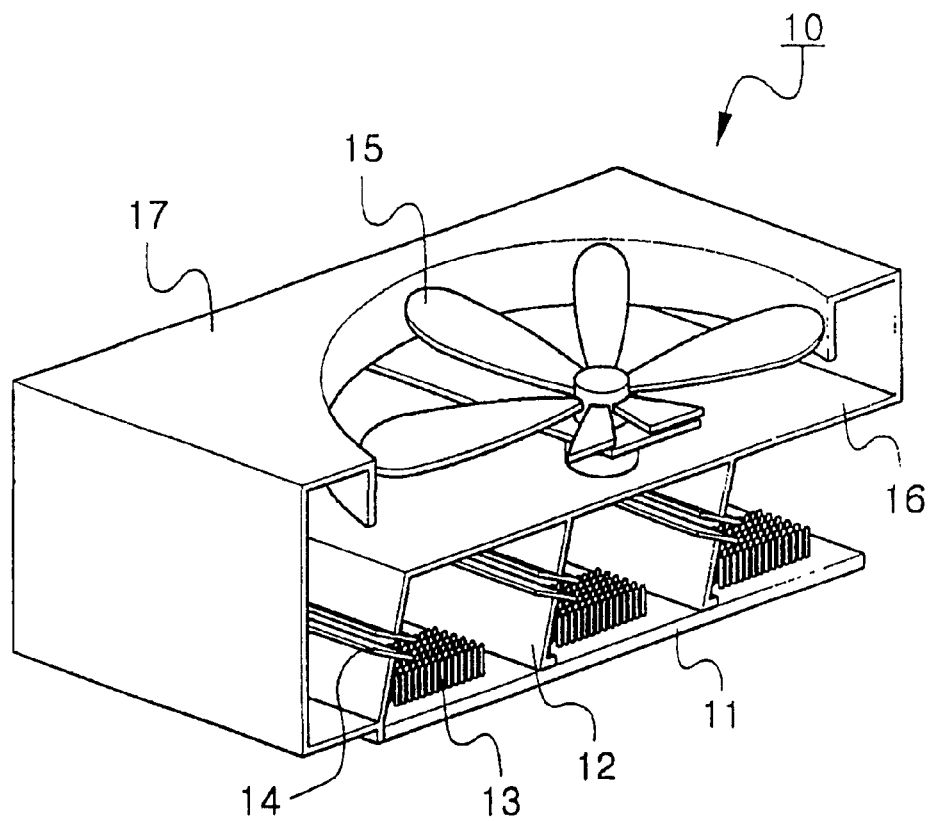
FIG. 2 illustrates a partially broken perspective view of the first embodiment of the present invention.

For the FIG. 2, the reference number 10 represents the heat sink according to the present invention, and the heat sink 10 is the type of rectangular parallel-piped as a whole, and one side of it (right side in the figure) is open. The bottom plate 11 of the heat sink 10 is attached with resin or contacted by pressure.

The inner part of the heat sink 10 is separated to upper space and lower space by the upper-lower part separating plate 16. In the upper part, the fan 15 which deflates air from inside to outside or supply air from outside to inside in order to supply cooling air in the heat sink 10 through the nozzle part 14 that will be described later is attached on the circular hole formed on the ceiling plate 17. The reference number 18 is the motor to operate the fan 15.

The lower part of the heat sink 10 divided by the upper-lower part separating plate 16 has many side part separating plates 12 to divide the space between the upper-lower part separating plate 16 and bottom plate 11 into many sections. The side part separating plates 12 are formed to be inclined to the bottom plate 11 at an angle from 15 degree to 45 degree.

In addition, in the middle of each of the side separating plates the nozzle parts 14 are formed in normal direction to the side part separating plates 12. The nozzle parts 14 are composed by inserting two thin and long plates of narrow width to the open hole formed in the side part separating plates 12 and the two plates can be formed to be parallel to each other or to be funnel-shaped to have wider width in the air inflow part and narrower width in the air outflow part.

Many pin-type fins 13 of villosity shape are formed on the lower side of the bottom plate 11 separated as many divisions by the side part separating plate 12. These pin-type fins 13 emits the heat that is transferred from the heating device to the bottom plate 11 and the surface heat is emitted rapidly by the cooling air coming from the nozzle part 14.

Figure 3:
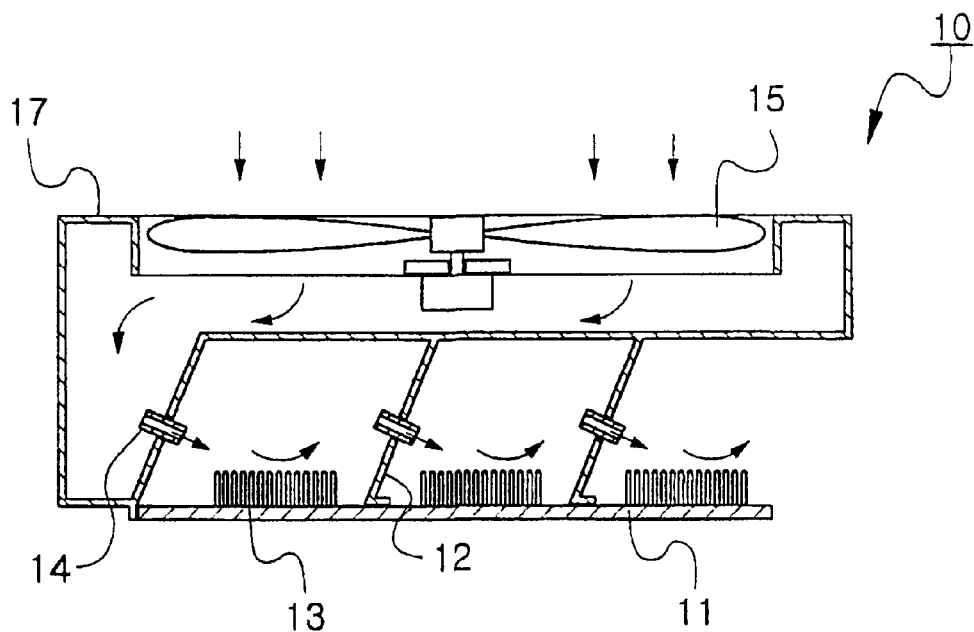
FIG. 3 illustrates a cross sectional view of FIG. 2.

The operation of the heat sink in the present invention described as above is as follows:

If the fan connected to electric power supply which is not illustrated in the figure is operated, the cooling air generated by the fan is supplied to the nozzle part along the direction indicated by an arrow in the FIG. 3, and because the nozzle part 14 is faced on the pin-type fins 13 at an angle of inclination from 15 degree to 45 degree, the cooling air is supplied to be inclined to the pin-type fins 13.

The cooling air hits on the pin-type fins 13 of the heat sink with an inclination and cools down the heat emitted from the pin-type fins 13. After cooling the pin-type fins 13 in the left-most division, the cooling air is supplied to the upside of the pin-type fins 13 in the right division with an inclination through the nozzle part 14 and then it is supplied again to the pin-type fins 13 in the right-most division with an inclination through the nozzle part 14.

Figure 4:
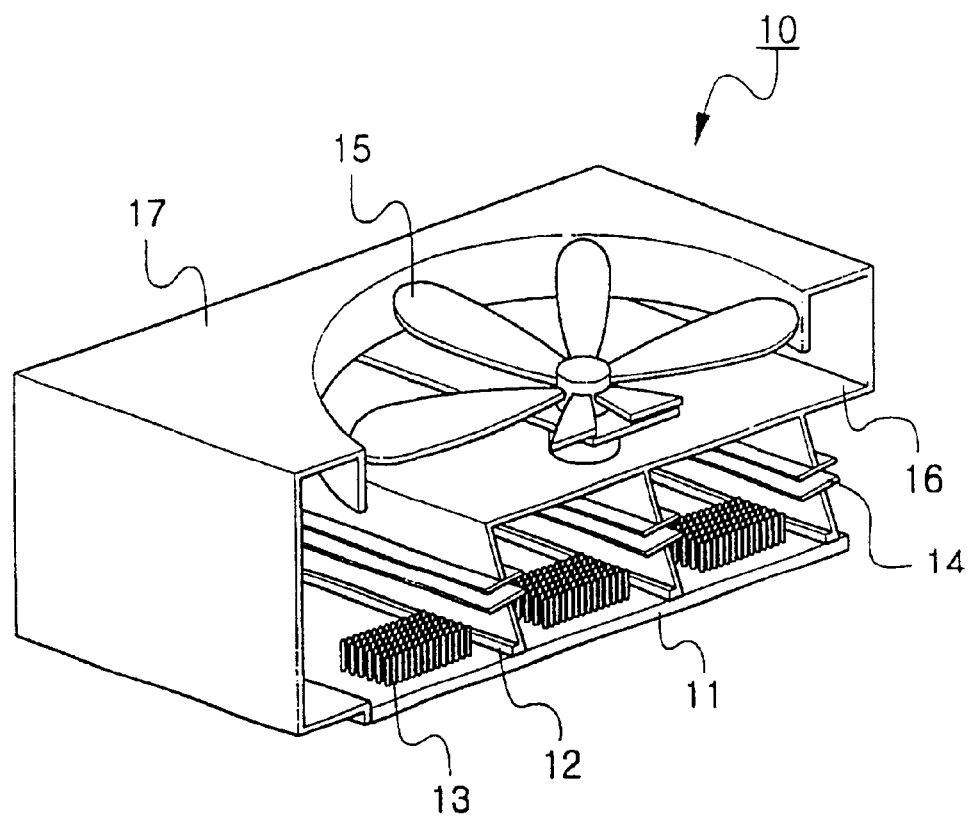
FIG. 4 illustrates a partially broken perspective view of the modified example of the first embodiment.
Figure 5:
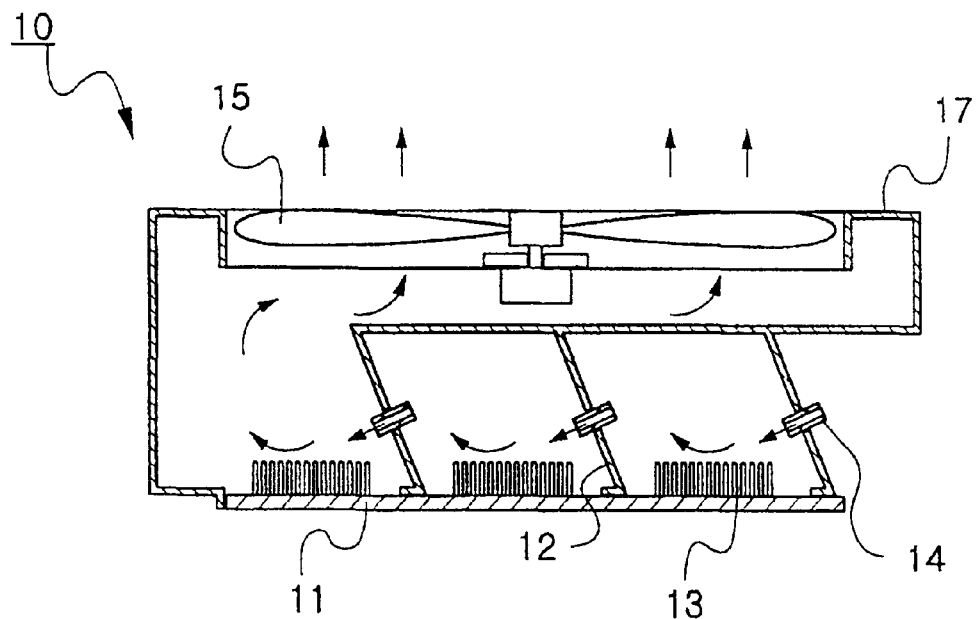
FIG. 5 illustrates a cross sectional view of FIG. 4.

The FIG. 4 and FIG. 5 are the modified examples of the first embodiment.

These modified examples are almost the same as the first embodiment in the whole constitution, but the nozzle is directed to suck the cooling air from outside to the inside of the heat sink. On the contrary to the first embodiment, therefore, the direction of the rotation of the fan is the sucking direction which outlets the inside air to outside.
(Second Embodiment)

Followings are the description about the second embodiment of the present invention referring to the FIG. 6 to FIG. 9. In the second embodiment, the same numbers are designated for the same part of the first embodiment and the descriptions are omitted.

Figure 6:
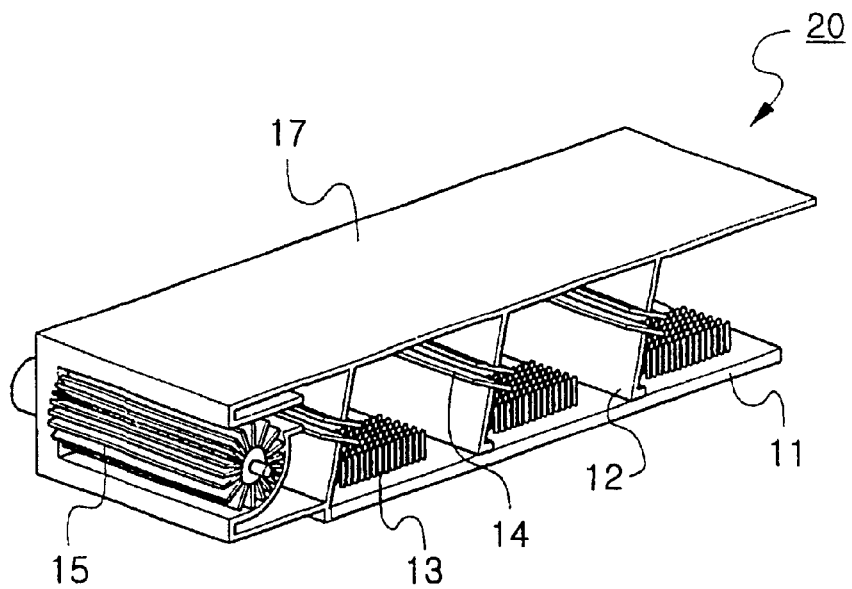
FIG. 6 illustrates a partially broken perspective view of the second embodiment of the present invention.
Figure 7:
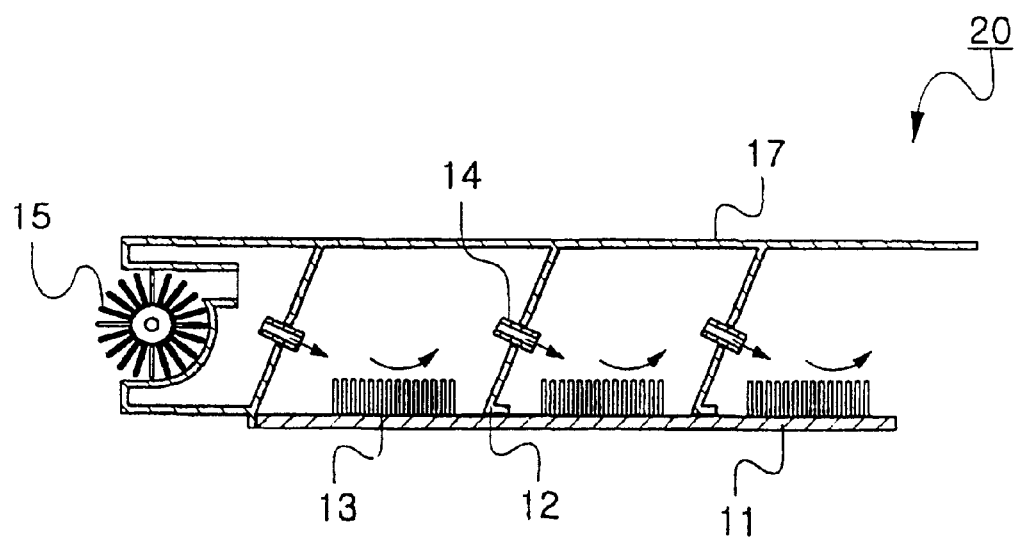
FIG. 7 illustrates a cross sectional view of FIG. 6.

In the FIG. 6, the reference number 20 represents the heat sink according to the present invention and the heat sink is the type of rectangular parallel piped as a whole, and one side of it (right side in the figure) is open. The bottom plate 11 of the heat sink 10 is attached with resin or contacted by pressure.

The inner part of the heat sink forms a space with the ceiling plate 17 and the bottom plate 11, and the fan 15 which deflates air from inside to outside or supply air from outside to inside in order to supply cooling air in the heat sink 10 through the nozzle part 14 that will be described later is attached on the opposite side of the open side described above.

In the heat sink, there are many side parts separating plates 12 to separate the space between the ceiling plate 17 and bottom plate 11 into many divisions. The side part separating plates 12 are formed to be inclined to the bottom plate 11 at an angle from 15 degree to 45 degree.

Also, in the middle of each of the side separating plates 12, the nozzle parts 14 are formed in normal direction to the side part separating plates 12. The composition of these nozzle parts 14 is the same as the first embodiment.

Many pin-type fins 13 with villosity shape are formed on the lower side of the bottom plate 11 separated as many divisions by the side part separating plate 12. These pin-type fins 13 emits the heat that is transferred from the heating device to the bottom plate 11 and the surface heat is emitted rapidly by the cooling air coming from the nozzle part 14.

The operation of the second embodiment described as above is as follows:

If the fan 15 connected to electric power supply that is not illustrated in the figure is operated, the cooling air generated by the fan is supplied to the nozzle part 14 along the direction indicated by an arrow in the FIG. 6, and because the nozzle part 14 is faced on the pin-type fins 13 at an angle of inclination from 15 degree to 45 degree, the cooling air is supplied to be inclined to the pin-type fins 13.

The cooling air hits on the pin-type fins 13 of the heat sink with an inclination and cools down the heat emitted from the pin-type fins 13. After cooling the pin-type fins 13 in the left-most division, the cooling air is supplied to the upside of the pin-type fins 13 in the right division with an inclination through the nozzle part 14, and then it is supplied again to the pin-type fins 13 in the right-most division with an inclination through the nozzle part 14.

Figure 8:
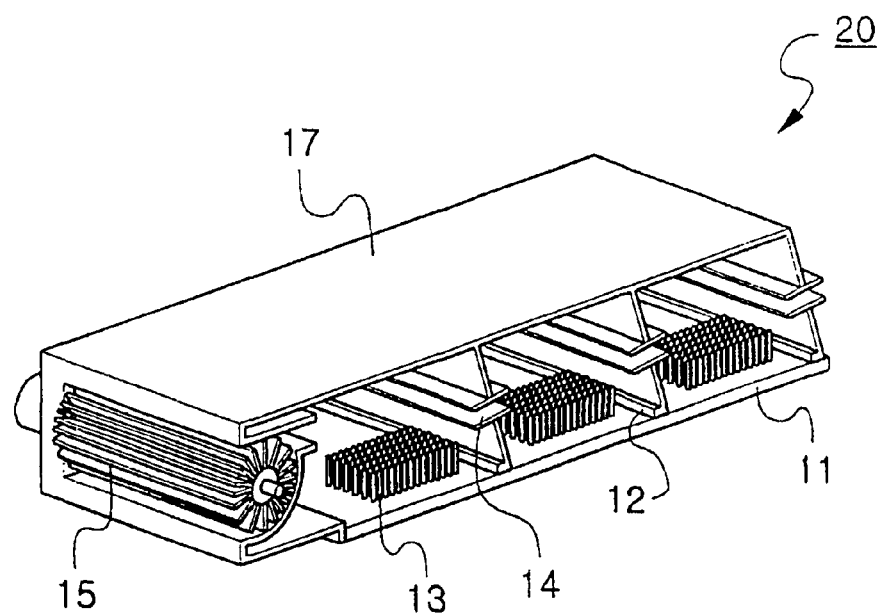
FIG. 8 illustrates a partially broken perspective view of the modified example of the second embodiment.
Figure 9:
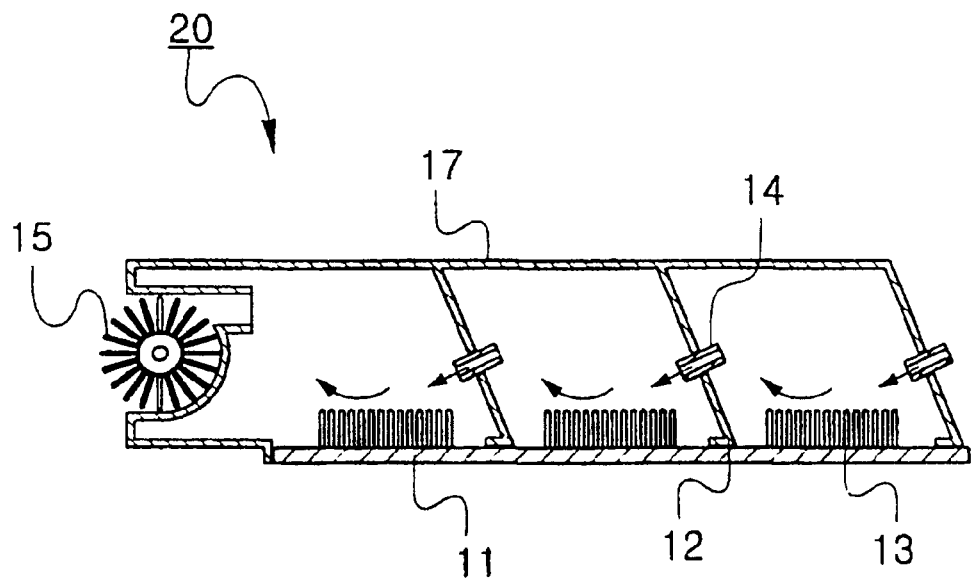
FIG. 9 illustrates a cross sectional view of FIG. 8.

The FIG. 8 and FIG. 9 are the modified embodiment of the first embodiment.

This modified embodiment is almost the same as the first embodiment in the whole constitution, but the nozzle is directed to suck the cooling air from outside to the inside of the heat sink. On the contrary to the first embodiment, therefore, the direction of the rotation of the fan is the sucking direction which outlets the inside air to outside.

Next is the inspection on the relation between the dust and the efficiency of the heat sink according to this invention and conventional invention.

Figure 10A:
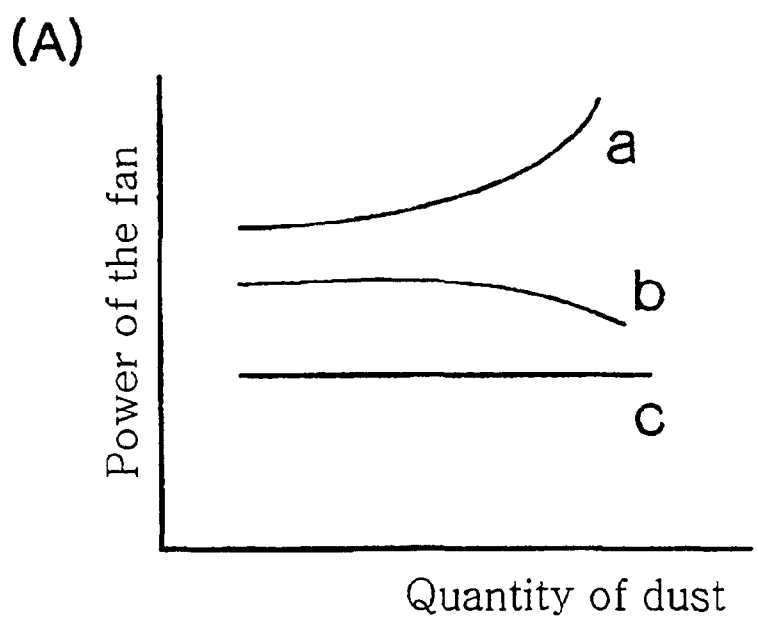
FIGS. 10A to 10C illustrate graphs showing relationships between dust deposited in the heat sink and power of the fan, air quantity of the cooling air stream and heat transmission quantity of the heat sink.
Figure 10B:
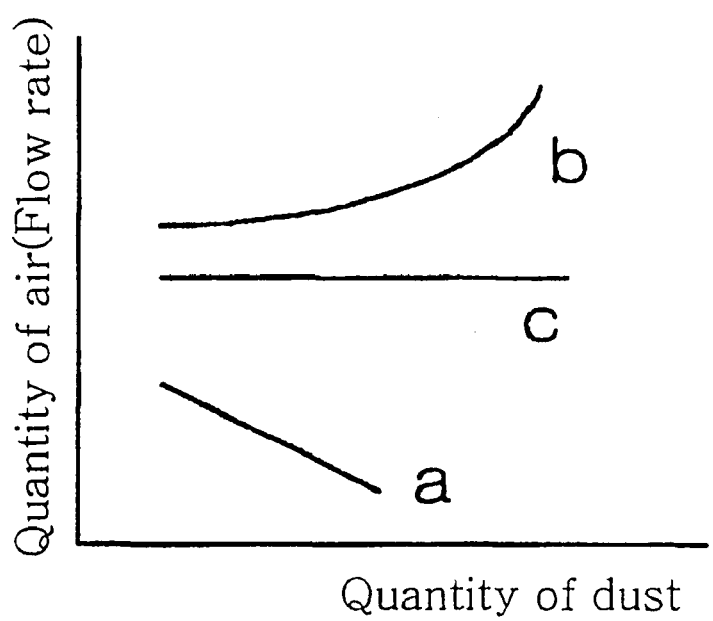
Figure 10C:
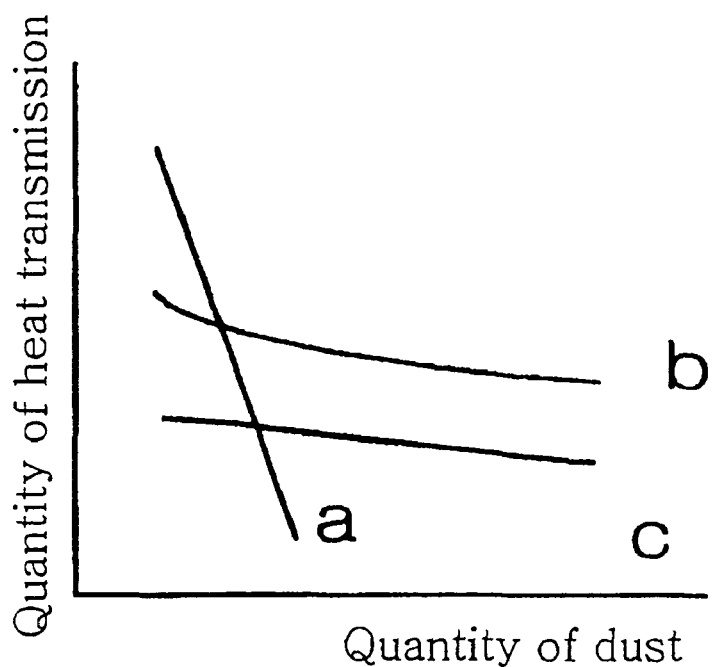

FIGS. 10A to 10C are the graphs which represent the relationship between the dusts deposited in the heat sink, the power of fan, and the relation between the flow rate of cooling air and the heat transmission rate of heat sink respectively.

Figure 1A:
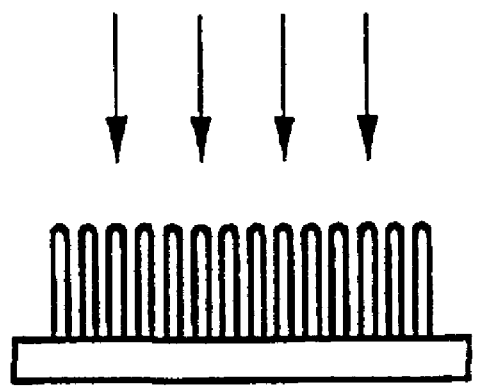
FIGS. 1A to 1D illustrate heat sinks in the conventional art.
Figure 1B:
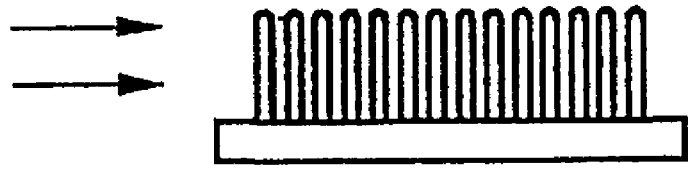
Figure 1C:
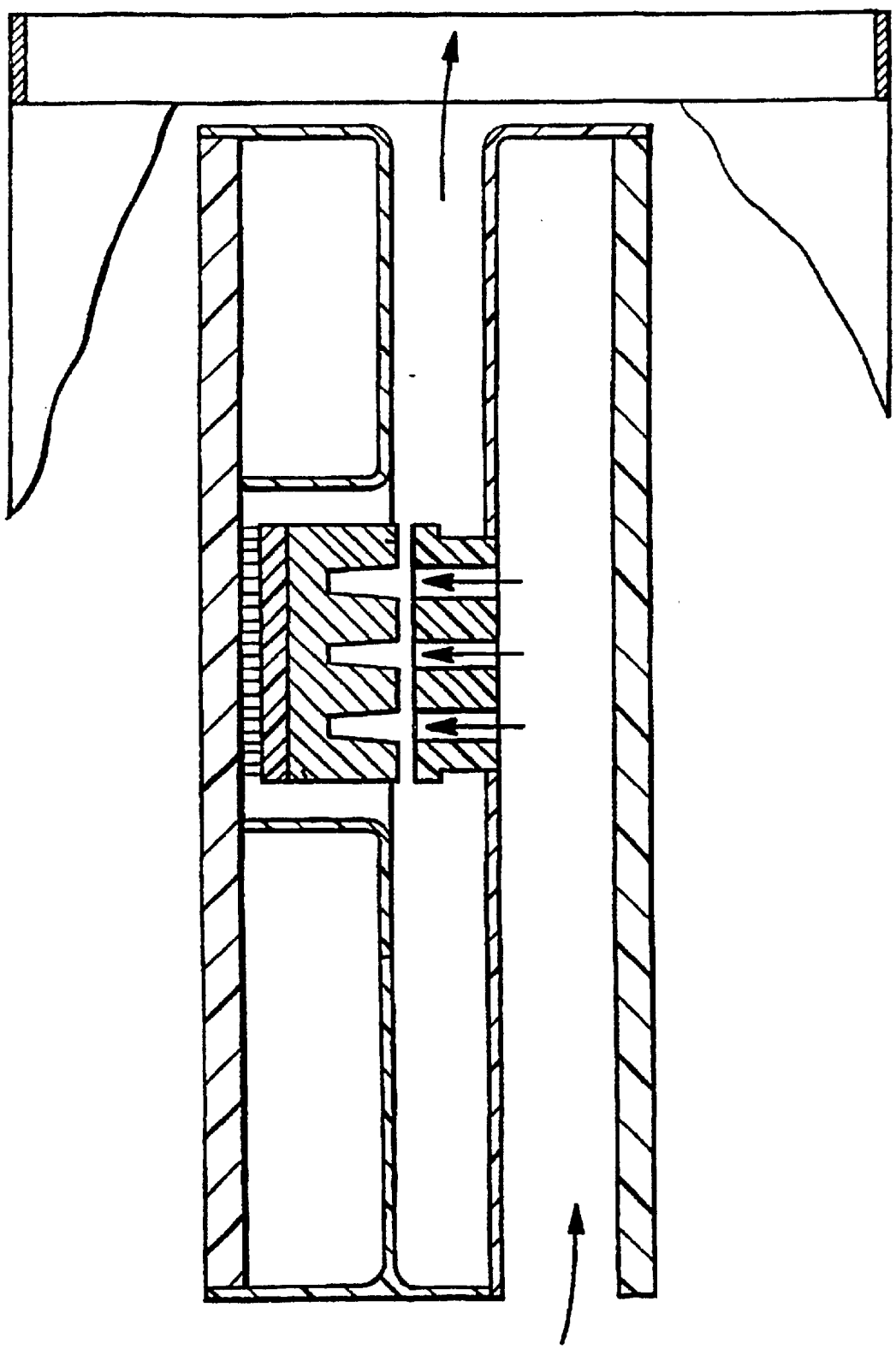
Figure 1D:
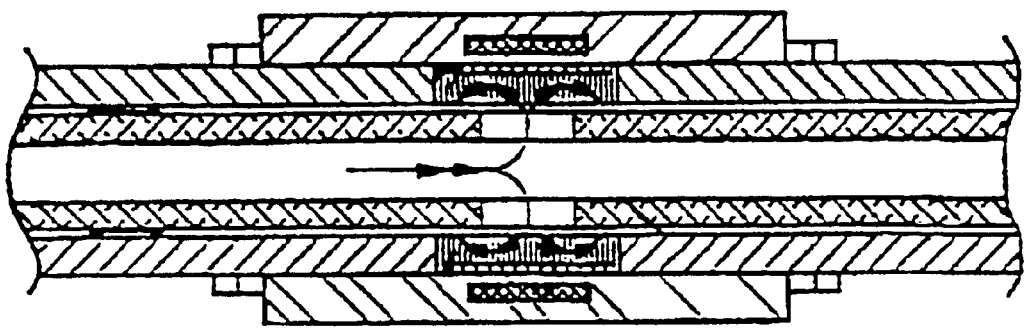

In each figure, line a is about the method to flow the cooling air parallel to the base of the heat sink, as shown in FIG. 1B, line b is about the cooling method of this invention and line c is about the method to flow the cooling air perpendicular to the base of heat sink from upper part of the fan to the downside.

Method a where the cooling air of the fan flows in the parallel direction of the base of pin-type fins has the largest rate of heat transmission in the ideal case of no dust (see FIG. 10C). But if the accumulated dusts are increased and the fore part touched with the air is clogged, the flow of cooling air is obstructed most directly and the flow is stopped soon, therefore, the power of the fan is increased rapidly, and the flow rate and the heat transmission rate comes to lessen rapidly.

On the other hand, in case of the method c which flows cooling air perpendicularly from upper part to the base, the power of fan is hardly changed. It is because there are little effects of dusts on the air stream from sucking air to inject it onto the pin-type fins, thus, there is no decrement of flow rate depending on the increment of dusts. In case of long-term use, however, the dusts attached to the fin decrease the heat transmission area. But these decrements in the heat transmission area does not effect on the decrement of heat transmission rate, because the surface area hit on the air stream is small in this method. Thus the change in the heat transmission rate depending on the increment of dust is slow as shown in FIG. 10C.

On the other hand, in method b of this invention, the cooling air is hit on the pin-type fins with an inclination through nozzle with free space of upper part, so the power of fan shows a tendency to be decreased depending on the increment of dusts. And when the air flows through the dust covered part, it can not hit on the whole pin-type fins but it hit on the upper part of pin-type fins, therefore, the route of air stream is shortened instead. Thus, the power consumption comes to be decreased. So the flow rate is increased and the heat transmission area comes to be decreased and the total heat transmission rate comes to be diminished somewhat. However, in each division, the pin-type fins and the cooling air hit each other with an inclination, so that the so-called dead zone where the pin-type fins cannot be reached by the cooling air is small, and the decrement of heat transmission rate depending on the increment of dusts is relatively small.

Consequently, the present invention is more favorable than the conventional methods, if it is used in the real products.

Industrial Applicability

As described above, according to the present invention by supplying cooling air from the fan to pin fins (pin-type fins) with an inclination, nice heat sink that has high cooling efficiency and is not effected on the accumulation of alien substances such as dusts can be made.

Though the present invention is described based upon the desirable embodiment at present, it is meant to illustrate above embodiments and it is not meant to limit the scope of the present invention.

Anyone who has knowledge in the technical field of the present invention, after reading above technical descriptions, may be able to do various modifications and transformations. Therefore, the attached claims are aimed to include not only the embodiments described above, but also all the modifications and transformations which are included in the technical scope of the present invention.

What is claimed is:

1. A heat sink, comprising;
   a rectangular parallel-piped body whose bottom plate is attached to a heat-generating surface of a heat-generating device;
   an upper-lower part separating plate to separate the inner part of the rectangular parallel-piped body into upper and lower parts;
   side part separating plates formed between the bottom plate and the upper-lower parts separating plate with a slope to separate the lower space formed by the upper-lower separating plates into a plurality of sections;
   nozzle parts inserted in the middle of the side part separating plates with a slope to its attachment surface;
   a plurality of pin-type fins formed in the bottom surface of a plurality of sections separated by the upper-lower parts separating plates; and
   air stream transportation means installed on the upper space formed by the upper-lower parts separating plates and supplying a cooling air stream to the fins through the nozzle parts.

2. A heat sink, comprising;
   a rectangular parallel-piped body whose bottom plate is attached to heat-generating surface of a heat-generating device;
   side part separating plates formed between the bottom plate and a ceiling plate of the body with a slope to separating the inner part of the rectangular parallel-piped body into many sections;
   nozzle parts inserted in the middle of the side part separating plates with a slope to its attachment surface;
   a plurality of pin-type fins formed in the bottom surface of a plurality of sections separated by the side part separating plates; and
   air stream transportation means installed on the most end section among a plurality of sections and supplying cooling air stream to the fins through the nozzle parts.

3. The heat sink according to claim 1, wherein the slope of the side part separating plates to the base part is in the range of 15 degree to 45 degree.

4. The heat sink according to claim 1, wherein the air stream transportation means is fan.

5. The heat sink according to claim 1, wherein the air stream transportation mean is blower.

6. The heat sink according to claim 4, wherein the fan forces air in from out side the heat sink.

7. The heat sink according to claim 4, wherein the fan sucks air out from the inner part of the heat sink.

8. The heat sink according to claim 1, wherein the outlet area of the nozzle area is formed narrower than the inlet area of it.

9. The heat sink according to claim 2, wherein the slope of the side part separating plates to the base part is in the range of 15 degree to 45 degree.

10. The heat sink according to claim 2, wherein the air stream transportation means is fan.

11. The heat sink according to claim 2, wherein the air stream transportation mean is blower.

12. The heat sink according to claim 2, wherein the outlet area of the nozzle area is formed narrower than the inlet area.

13. The heat sink according to claim 10, wherein the fan forces air in air from outside the heat sink.

14. The heat sink according to claim 10, wherein the fan sucks air out from the inner part of the heat sink.

* * * * *